United States Patent
Gutgold et al.

(10) Patent No.: US 10,128,647 B2
(45) Date of Patent: Nov. 13, 2018

(54) CABLE MANAGEMENT CLASP

(71) Applicant: TYCO ELECTRONICS CORPORATION, Berwyn, PA (US)

(72) Inventors: Glen Gutgold, Harrisburg, PA (US); Tracy Lee Smith, Harrisburg, PA (US); Steven Kandybowski, Tower City, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 8 days.

(21) Appl. No.: 14/976,327

(22) Filed: Dec. 21, 2015

(65) Prior Publication Data

US 2017/0179707 A1 Jun. 22, 2017

(51) Int. Cl.
*H02G 15/00* (2006.01)
*H05K 5/02* (2006.01)

(52) U.S. Cl.
CPC .......... *H02G 15/00* (2013.01); *H05K 5/0247* (2013.01)

(58) Field of Classification Search
CPC .............................. H02G 15/00; H02G 15/007
See application file for complete search history.

(56) References Cited

U.S. PATENT DOCUMENTS

| | | | | |
|---|---|---|---|---|
| 5,530,787 A * | 6/1996 | Arnett | ................. | G02B 6/3887 385/136 |
| 6,280,232 B1 * | 8/2001 | Beecher | ................. | H01R 24/64 439/418 |
| 6,604,861 B2 * | 8/2003 | Chen | .................... | G02B 6/3869 385/56 |
| 6,808,315 B2 * | 10/2004 | Asada | ................. | G02B 6/3887 385/77 |
| 7,463,812 B2 * | 12/2008 | Coburn | ............... | G02B 6/4459 385/136 |
| 7,889,962 B2 * | 2/2011 | Nair | ...................... | G02B 6/4452 385/134 |
| 8,172,601 B2 * | 5/2012 | Adachi | ............... | H02G 3/0437 385/60 |
| 2011/0108306 A1 * | 5/2011 | Parham, Jr. | ............ | H01R 24/64 174/81 |

\* cited by examiner

Primary Examiner — William H Mayo, III
Assistant Examiner — Hiram E Gonzalez

(57) ABSTRACT

A cable management clasp includes a clasp body extending between a connector end and a cable end configured to receive a cable array of cables through a cable entrance. The cable array exits the clasp body at the connector end through a cable exit. The clasp body holds the cables of the cable array in a parallel arrangement. The clasp body extends along mutually perpendicular longitudinal, lateral and elevation axes. The clasp body has a mandrel including a cable bend surface having a bend radius greater than a minimum bend radius of the cables. The cables transition around the cable bend surface between the cable entrance and the cable exit. The mandrel directs the cable array to rotate a roll angle about the elevation axis and the mandrel directs the cable array to rotate a yaw angle about the longitudinal axis.

20 Claims, 6 Drawing Sheets

CABLE MANAGEMENT CLASP

BACKGROUND

The subject matter herein relates generally to cable management clasps for a cable array of a communication system.

Various communication systems may include an array of electrical connectors for interconnecting different communication devices. The electrical connectors are electrically connected by cables to communicatively couple the corresponding electrical connectors. However, management of the cables, particularly in high density applications or in applications having limited space between the electrical connectors is problematic. For example, the various cables may be twisted, intertwined or otherwise difficult to manage. It can be difficult to route and manage the cables within the allotted space.

Accordingly, a need remains for a mechanism or device that facilitates managing the cables between electrical connectors.

BRIEF DESCRIPTION

In an embodiment, a cable management clasp is provided including a clasp body extending between a connector end at or near an electrical connector and a cable end configured to receive a cable array of cables through a cable entrance. The cable array exits the clasp body at the connector end through a cable exit. The clasp body holds the cables of the cable array in a parallel arrangement. The clasp body extends along mutually perpendicular longitudinal, lateral and elevation axes. The clasp body has a mandrel including a cable bend surface having a bend radius greater than a minimum bend radius of the cables. The cables transition around the cable bend surface between the cable entrance and the cable exit. The mandrel directs the cable array of cables to rotate a roll angle about the elevation axis and the mandrel directs the cable array of cables to rotate a yaw angle about the longitudinal axis.

In another embodiment, a cable management clasp is provided including a clasp body extending between a connector end at or near an electrical connector and a cable end configured to receive a cable array of cables through a cable entrance. The cable array exits the clasp body at the connector end through a cable exit. The clasp body holds the cables of the cable array in a parallel arrangement. The clasp body extends along mutually perpendicular longitudinal, lateral and elevation axes. The clasp body has a guide bar at the connector end. The guide bar holds the cables of the cable array generally along a cable exit plane defined by the longitudinal axis and the lateral axis with the cables exiting the cable exit along the lateral axis. The clasp body has a mandrel including a cable bend surface having a bend radius greater than a minimum bend radius of the cables. The cables transition around the cable bend surface between the cable entrance and the cable exit. The mandrel has an organizer tray at the cable end. The organizer tray receives the cables of the cable array through the cable entrance and holds the cables of the cable array generally along a cable entrance plane defined by the longitudinal axis and the elevation axis with the cables entering the cable entrance along the longitudinal axis.

In a further embodiment, a communication system is provided including first and second electrical connectors that each include signal conductors. A plurality of cable arrays extend between the first and second electrical connectors. Each cable array has a plurality of cables electrically connected to corresponding conductors of the first and second electrical connectors. The cables are arranged in a parallel arrangement with the other cables of the corresponding cable array. A first cable management clasp holds the cable arrays. The first cable management clasp is positioned at or near the first electrical connector to transition the cables into the first electrical connector. The first cable management clasp includes a clasp body extending between a connector end facing the first electrical connector and a cable end configured to receive the cable arrays through a cable entrance. The cable arrays exit the clasp body at the connector end through a cable exit. The clasp body holds the cables of the cable arrays in the parallel arrangements. The clasp body extends along mutually perpendicular longitudinal, lateral and elevation axes. The clasp body has a mandrel including a cable bend surface having a bend radius greater than a minimum bend radius of the cables. The cables transition around the cable bend surface between the cable entrance and the cable exit. The mandrel directs the cable arrays to rotate a roll angle about the elevation axis and the mandrel directs the cable arrays to rotate a yaw angle about the longitudinal axis.

DETAILED DESCRIPTION

Figure 1:
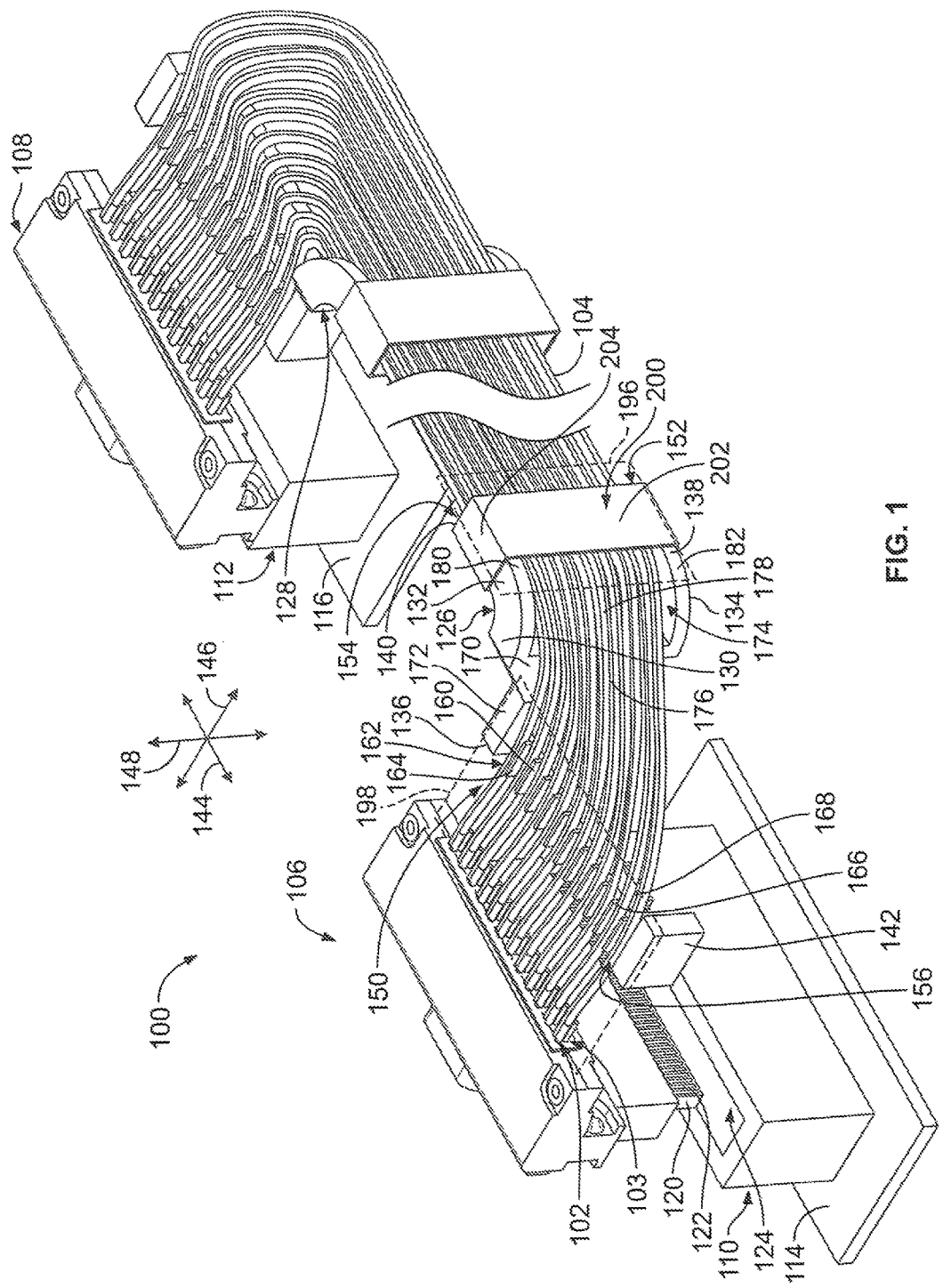
FIG. 1 is a front perspective view of a portion of a communication system formed in accordance with an embodiment for data communication.

FIG. 1 is a front perspective view of a portion of a communication system 100 formed in accordance with an embodiment for data communication. The communication system 100 includes one or more cable arrays (the illustrated embodiment includes first and second cable arrays 102, 103) each having a plurality of cables 104 interconnecting electrical connectors 106, 108. The electrical connectors 106, 108 may be directly mounted to circuit boards or may be mated with header or receptacle connectors mounted to circuit boards. By way of example only, the communication system 100 may be used in telecom and computer applications, routers, servers, supercomputers, and uninterruptible power supply (UPS) systems.

In the illustrated embodiment, the electrical connectors 106, 108 are plug connectors including a plug end configured to be mated with receptacle connectors 110, 112 mounted to corresponding circuit boards 114, 116. The electrical connectors 106, 108, in the illustrated embodiment, each include a card edge 120 with a plurality of signal conductors 122, such as pads or a circuit card or contacts held by a module, that is configured to be plugged into a card slot 124 of the corresponding receptacle connector 110, 112.

The cables 104 are electrically connected to corresponding conductors 122 and are used to electrically interconnect the electrical connector 106 with the electrical connector 108. The cables 104 may be arranged in pairs configured to carry differential pair signals. For example, one cable 104 from the first cable array 102 and one cable of the second cable array 103 are arranged in pairs following each other in close proximity between the electrical connectors 106, 108. The cables 104 have conductors or wires therein that are terminated to the conductors 122 of the electrical connectors 106, 108, such as by welding, soldering, crimping, or other termination processes. The cables 104 may have a single wire (for example, coaxial conductor) or multiple wires (for example, twin axial conductor) therein.

In various embodiments, numerous cables 104 are provided in the communication system 100 and management of the cables 104 is important. The cables 104 may be arranged as the cable arrays 102, 103 in arrays or bundles, which are groups of cables that extend to/from the electrical connectors 106, 108. The cables 104 within each cable array 102, 103 extend generally parallel to one another as the cables 104 extend between the electrical connectors 106, 108. For example, at the exit points from the electrical connectors 106, 108, the cables 104 are at predetermined positions and spacings. Such positions and spacing are generally maintained through the transition zone between the electrical connectors 106, 108. For example, the cable arrays 102, 103 may be arranged in a stacked parallel arrangement with the cables 104 in two parallel arrays. The cables 104 are independent from each other such that the cables 104 are capable of moving independently.

In an exemplary embodiment, cable management clasps 126, 128 are used to manage the cables 104 and maintain the relationships between the cable arrays 102, 103 and the individual cables 104, particularly at or near the entry/exit points of the cables 104 from the electrical connectors 106, 108. Other devices, such as clips, tape or other types of devices, may be used along the lengths of the cables, such as in the transition zone remote from the electrical connectors 106, 108.

Optionally, the cable management clasps 126, 128 may be similar or identical. The description below is in reference to the first cable management clasp 126; however the description may be applicable to the cable management clasp 128. The cable management clasp 126 may be configured to maintain the relative positions among the cables 104 of the cable arrays 102, 103 as the cables 104 transition out of the electrical connectors 106, 108 and are routed through the transition zone, which may ease assembly and reduce assembly time. In an exemplary embodiment, the communication system 100 may be used within a component or system that limits the space for the circuit boards 114, 116, electrical connectors 106, 108 and the cables 104. The cable management clasp 126 may control routing of the cables 104 from the electrical connector 106, such as by bending the cables approximately 90° to change the routing of the cables 104 from the back of the electrical connector 106. The cable management clasp 126 may limit damage to the cables 104 by ensuring that the cables 104 do not exceed a bend limit. For example, the cable management clasp 126 may have a predetermined bend radius greater than the minimum bend radius to avoid damage to the cables 104.

At the cable exit from the electrical connector 106, the cables 104 of the first cable array 102 are coplanar and extend parallel to one another, such as along a horizontal plane. Similarly, the cables 104 of the second cable array 103 are coplanar and extend parallel to one another, such as along a horizontal plane directly below the first cable array 102. The cable management clasp 126 is used to hold the cables 104 in similar coplanar and parallel arrangements as the cables 104 transition out of the cable management clasp 126 to the transition zone toward the cable management clasp 128. The cable management clasp 126 securely holds the cables 104 in a pre-arranged order. The cable management clasp 126 is configured to hold the cables 104 in substantially fixed positions with respect to one another as the cables 104 extend through the cable management clasp 126.

The cable management clasp 126 may be placed immediately behind the electrical connector 106 or may be positioned a small distance behind the electrical connector 106. Optionally, the cable management clasp 126 may be mounted to the cables 104 and support the relative positions of the cables 104. The cable management clasp 126 may be slid along the cables 104 to an appropriate position behind the electrical connector 106. Alternatively, the cable management clasp 126 may be mounted to the electrical connector 106 and support the cables 104.

Figure 2:
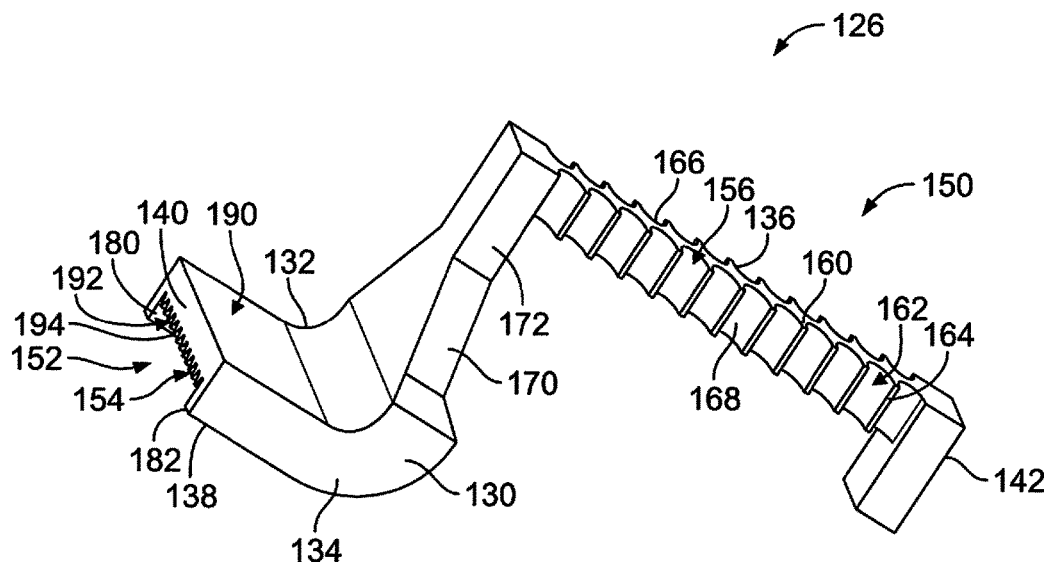
FIG. 2 is a bottom, front perspective view of a cable management clasp for the communication system formed in accordance with an exemplary embodiment
Figure 3:
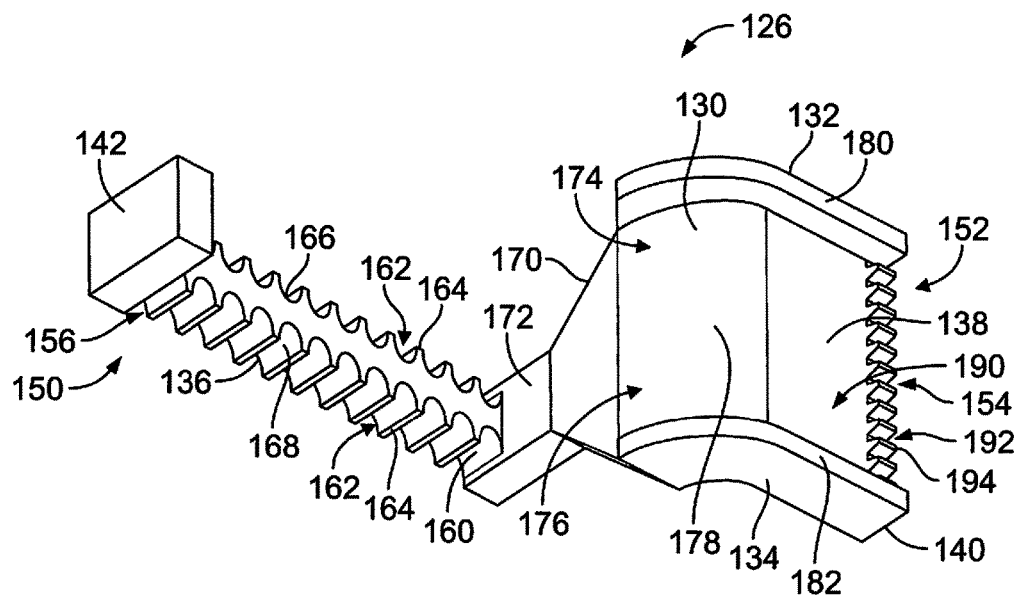
FIG. 3 is a bottom, rear perspective view of the cable management clasp shown in FIG. 2.

With additional reference to FIGS. 2 and 3, FIG. 2 is a bottom, front perspective view and FIG. 3 is a bottom, rear perspective view of the cable management clasp 126 formed in accordance with an exemplary embodiment. The cable management clasp 126 includes a clasp body 130, which may be molded from a plastic material as a unitary piece or multiple pieces. The clasp body 130 includes a top 132, a bottom 134, a front 136, a rear 138, and opposite first and second sides 140, 142. The clasp body 130 extends along mutually perpendicular longitudinal, lateral and elevation axes 144, 146, 148. In one particular normal orientation of the cable management clasp 126 in use (for example, with the electrical connectors 106, 108 mounted to circuit boards 114, 116 oriented horizontally), the top and bottom are offset along the elevation axis 148, the front 136 and the rear 138 are offset along the lateral axis 146, and the first and second sides 140, 142 are offset along the longitudinal axis 144. In one particular normal orientation of the cable management clasp 126 in use, the front 136 faces the electrical connector 106 (shown in FIG. 1) and the cables 104 (shown in FIG. 1) enter the cable management clasp 126 through the first side 140.

The clasp body 130 extends between a connector end 150 and a cable end 152. The connector end 150 may face and or be positioned at or near the electrical connector 106. Optionally, the connector end 150 may be provided at the front 136 of the clasp body 130. The cable end 152 is configured to receive the cables 104 of the cable arrays 102, 103 (shown in FIG. 1) through a cable entrance 154 at the cable end 152. The cable entrance 154 is provided at the first side 140, such as at the rear 138. The cable arrays 102, 103 transition from the first side 140 toward the second side 142 and transition forward toward the front 136 where the cables 104 exit the clasp body 130 at the connector end 150 through a cable exit 156. The cables 104 may be fanned out along the front 136 for interfacing with the electrical connector 106.

The clasp body 130 holds the cables 104 of the cable arrays 102, 103 in parallel arrangements as the cables 104 transition from the cable end 152 to the connector end 150. In an exemplary embodiment, the cable arrays 102, 103 are rotated or twisted by the clasp body 130 between the cable end 152 and the connector end 150. For example, the cable arrays 102, 103 may enter the cable management clasp 126 through the side 140 with a vertical arrangement and may exit the cable management clasp 126 from the front 136 with a horizontal arrangement. The cable arrays 102, 103 may be rotated about the elevation axis 148 (for example, to transition the cables 104 toward the front 136). The cable arrays 102, 103 may be rotated about the longitudinal axis 144 (for example, to transition the cables 104 from a vertical orientation to a horizontal orientation).

The clasp body 130 includes a guide bar 160 at the front 136. The guide bar 160 may define the cable exit 156. The guide bar 160 orients the cables 104 relative to each other for connection with the electrical connector 106. In an exemplary embodiment, the guide bar 160 includes a plurality of cable grooves 162 separated by tabs 164. The cable grooves 162 are configured to receive corresponding cables 104 and hold relative positions of the cables 104, which may correspond to positions of the cables 104 exiting the electrical connector 106. The tabs 164 may be scallop-shaped to cup around the cables 104 and hold the cables 104 in the cable grooves 162. The tabs 164 may have barbs or lances to dig into the jackets of the cables 104 to hold the clasp body 130 along the cables 104 and or to hold the relative positions of the cables 104 and the clasp body 130.

In an exemplary embodiment, the guide bar 160 includes an upper guide surface 166 and a lower guide surface 168 facing the top 132 and the bottom 134, respectively. The upper guide surface 166 supports the cables 104 of the first cable array 102. The lower guide surface 168 supports the cables 104 of the second cable array 103. Optionally, both the upper and lower guide surfaces 166, 168 include the cable grooves 162, which may be aligned with each other across the guide bar 160.

In other various embodiments, the cables 104 may pass along one side of the guide bar 160, such as along the upper guide surface 166. Optionally, a pair of the cables 104 from both cable arrays 102, 103 may be received in a same one of the cable grooves 162. In other various embodiments, the guide bar 160 may be devoid of individual cable grooves 162, but rather the guide bar 160 may define a single tray or trough the receives all of the cables 104 and generally maintains the cables 104 in the pre-arranged order between the opposite sides of the guide bar 160.

The clasp body 130 includes a mandrel 170 along an interior bend or corner of the clasp body 130, such as at the first side 140. The mandrel 170 is used to guide and transition cables 104 from the cable entrance 154 to the cable exit 156, such as to the guide bar 160. The mandrel 170 may define the cable entrance 154 at the first side 140.

The mandrel 170 includes a base 172, such as at a front of the mandrel 170. The guide bar 160 extends from the base 172, such as to the second side 142. In the illustrated embodiment, the guide bar 160 is provided at the front 136 and the second side 142, while the mandrel 170 is generally provided at the rear 138 and the first side 140. The guide bar 160 may be approximately centered along the elevation axis 148 between the top 132 and the bottom 134 while the mandrel 170 generally extends the entire thickness between the top 132 and the bottom 134. Optionally, the mandrel 170 and the guide bar 160 are integral and may be co-molded from a plastic material.

The mandrel 170 includes a trough 174 extending from the base 172. The trough 174 receives the cables 104 and guides the cables 104 such as through a bend. The trough 174 has a curved ramp 176 defining a cable bend surface 178. The cable bend surface 178 of the ramp 176 extends between opposite first and second rails 180, 182 that guide or hold the cables 104. The first and second rails 180, 182 are provided at the top 132 and the bottom 134 of the clasp body 130. The cable bend surface 178 is an interior corner of the clasp body 130 about which the cables 104 transition from the cable end 152 to the connector end 150.

In an exemplary embodiment, the cables 104 are transitioned and bent along the cable bend surface 178. The cable bend surface 178 has a bend radius greater than a minimum bend radius of the cables 104 to prevent damage to the cables 104 as the cables 104 are bent around the cable bend surface 178. The cable bend surface 178 of the mandrel 170 changes the direction of the cables 104 of the cable arrays 102, 103 from extending in a direction generally along the longitudinal axis 144 to a direction generally along the lateral axis 146. For example, the cable bend surface 178 may bend approximately 90° or another roll angle about the elevation axis 148. The cables 104 may follow the cable bend surface 178 for all or only part of the bend. For example, the cables 104 may start to transition away from the mandrel 170, such as to an open space away from the cable bend surface 178 (for example, toward the second side 142 or away from the interior corner defined by the mandrel 170) as the cables 104 start to transition to the guide bar 160. The cables 104 transitioning to the distal end of the guide bar 160 (for example, closer to the second side 142) may start to transition away from the cable bend surface 178 earlier than the cables 104 that transition to the interior side of the guide bar 160 (for example, closer to the first side 140). For example, in the illustrated embodiment, the upper cables 104 transition to the side of the guide bar 160 closest to the mandrel 170 and the lower cables 104 transition to the side of the guide bar 160 furthest from the mandrel 170. Other configurations are possible.

Additionally, in the open space to the side of the ramp 176, the cables 104 transition to the plane of the guide bar 160. For example, the cable arrays 102, 103 transition from a vertical orientation to a horizontal orientation. The cable arrays 102, 103 may rotate approximately 90° or another yaw angle about the longitudinal axis 144 during the transition from the cable end 152 to the connector end 150. In the illustrated embodiment, the upper cables 104 transition downward toward the guide bar 160, the lower cables 104 transition upward to the guide bar 160, and the middle cables 104 generally stay along the same central plane as they transition to the guide bar 160. Other configurations are possible, such as when the guide bar 160 is not approximately centered between the top 132 and the bottom 134.

In an exemplary embodiment, the mandrel 170 includes an organizer tray 190 at the cable end 152. The organizer tray 190 has a plurality of cable grooves 192 configured to receive corresponding cables 104. The cable grooves 192 are separated by tabs 194. The cable grooves 192 receive the cables 104 and hold relative positions of the cables 104, which may correspond to positions of the cables 104 through the transition zone between the cable management clasps 126, 128. The tabs 194 may be scallop-shaped to cup around the cables 104 and hold the cables 104 in the cable grooves 192. The tabs 194 may have barbs or lances to dig into the jackets of the cables 104 to hold the clasp body 130 along the cables 104 and/or to hold the relative positions of the cables 104 and the clasp body 130. In an exemplary embodiment, the tabs 194 extend rearward from the ramp 176 and the cable grooves 192 are open at the rear 138 to receive the cables 104. Optionally, each of the cable grooves 192 may receive a respective pair of the cables 104, such as one cable 104 from the first cable array 102 and one cable from the second cable array 103. Alternatively, each cable groove 192 may receive greater or fewer than two cables 104. In other various embodiments, the organizer tray 190 may be devoid of cable grooves 192, but still receives all of the cables 104 between the rails 180, 182.

In the illustrated embodiment, the cable end 152 is oriented to receive the cable arrays 102, 103 along a vertical cable entrance plane 196 and the connector end 150 is oriented to release the cable arrays 102, 103 along a horizontal cable exit plane 198. The cable entrance plane 196 is defined by the longitudinal axis 144 and the elevation axis 148, and the cable exit plane 198 is defined by the longitudinal axis 144 and the lateral axis 146. Other orientations are possible in alternative embodiments. The cable end 152 receives the cables 104 along the longitudinal axis 144 and the connector end 150 releases the cables 104 along the lateral axis 146.

With particular reference to FIG. 1, in an exemplary embodiment, the cable management clasp 126 includes a clasp 200 attached to the clasp body 130 at the cable end 152. The clasp 200 and clasp body 130 are configured to hold the cables 104 of the cable arrays 102, 103 at the cable end 152. The clasp 200 may be a lid coupled to the mandrel 170. Optionally, the clasp 200 is C-shaped including a clasp arm 202 and clasp fingers 204 at opposite ends of the clasp arm 202. The clasp 200 is discrete from the clasp body 130 and the clasp fingers 204 are coupled to the mandrel 170 such that the cable entrance 154 is defined between the clasp arm 202 and the mandrel 170. Alternatively, the clasp 200 may be integral with the clasp body 130 and connected thereto by a living hinge. In other various embodiments, the clasp 200 is tape or a zip tie around the mandrel 170 and the cable arrays 102, 103 used to hold the cables 104 in the trough 174.

Figure 4:
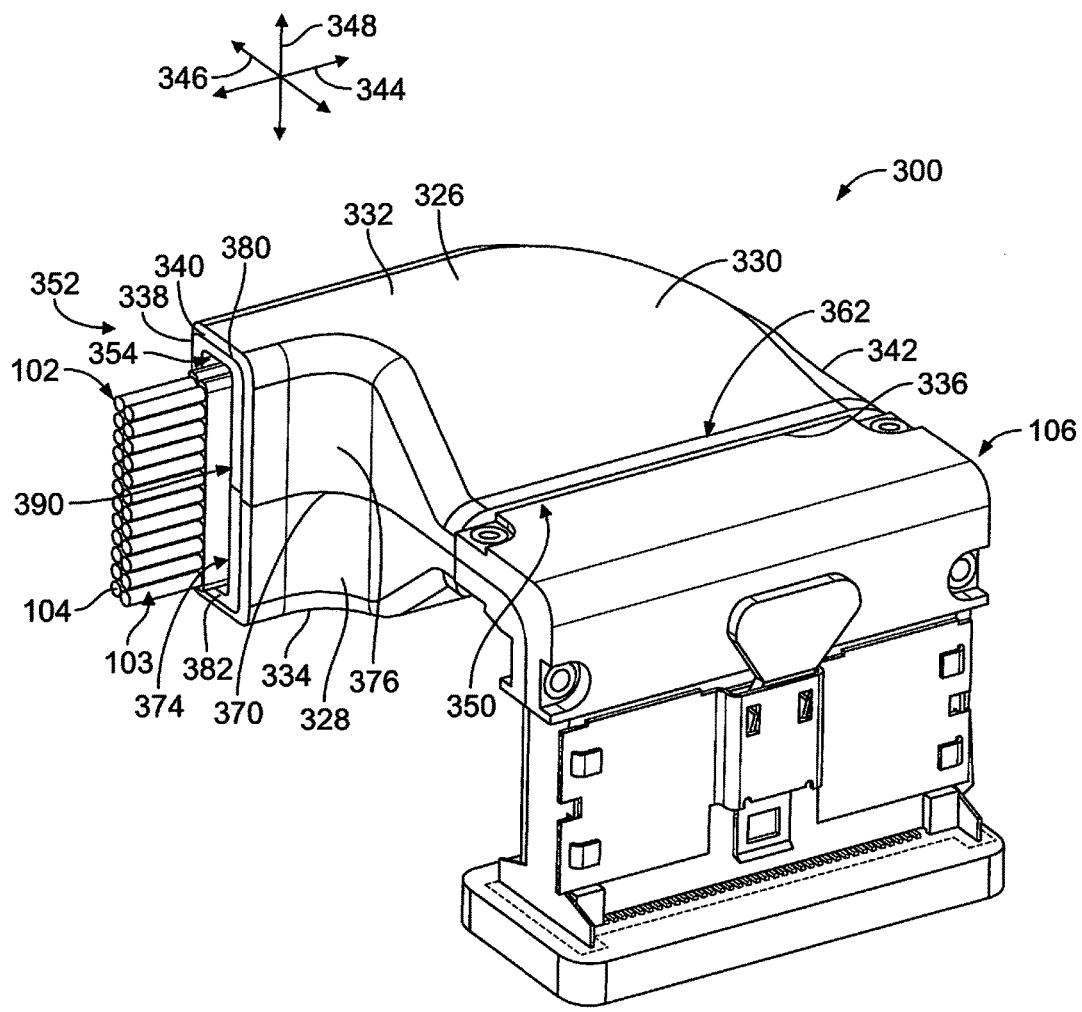
FIG. 4 is a rear perspective view of a cable management clasp formed in accordance with an exemplary embodiment.
Figure 5:
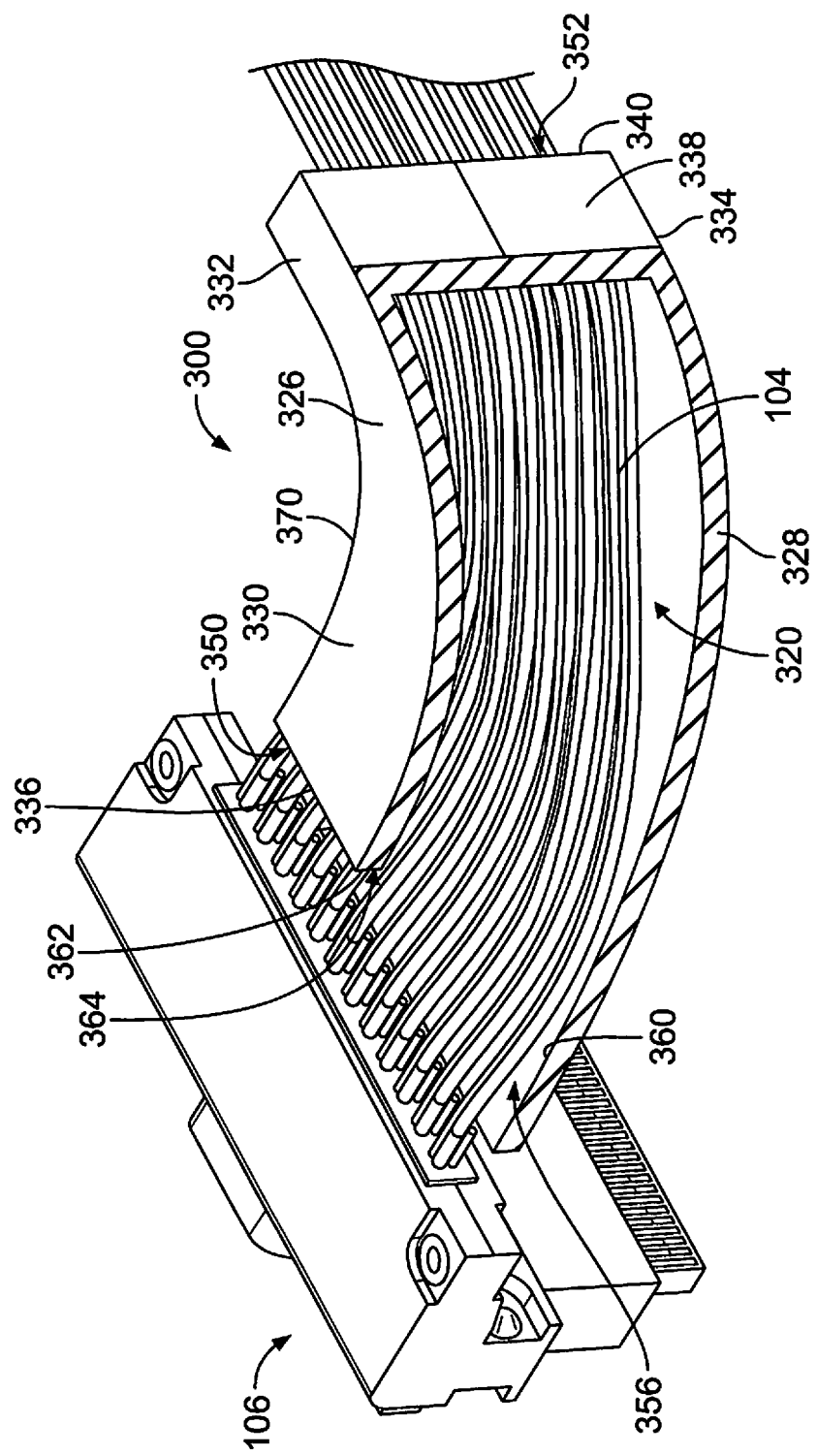
FIG. 5 is a partial sectional view of the cable management clasp showing cables therein.

FIG. 4 is a rear perspective view of a cable management clasp 300 formed in accordance with an exemplary embodiment. FIG. 5 is a partial sectional view of the cable management clasp 300 showing the cables 104 therein. The cable management clasp 300 may be similar to the cable management clasp 126 in operation and/or effect to hold and guide transition of the cables 104 to/from the electrical connector 106; however the cable management clasp 300 is enclosed rather than being open with the cables 104 being routed within an interior chamber 320 (shown in FIG. 5). Another cable management clasp 300 may be used in conjunction with the electrical connector 108 (shown in FIG. 1). The cable management clasp 300 limits the bending of the cables 104 during the transition, which reduces damage to the cables 104. The cable management clasp 300 is configured to hold the cables 104 in substantially fixed positions with respect to one another as the cables 104 extend through the cable management clasp 300.

The cable management clasp 300 includes a clasp body 330. In the illustrated embodiment, the clasp body 330 is a two-piece body including an upper shell 326 and a lower shell 328 enclosing the interior chamber 320. The shells 326, 328 are molded from a plastic material and coupled together around the cables 104. The clasp body 330 includes a top 332, a bottom 334, a front 336, a rear 338, and opposite first and second sides 340, 342. The clasp body 330 extends along mutually perpendicular longitudinal, lateral and elevation axes 344, 346, 348. The front 336 faces the electrical connector 106 and the cables 104 enter the cable management clasp 300 through the first side 340.

The clasp body 330 extends between a connector end 350 and a cable end 352. The connector end 350 may face and or be positioned at or near the electrical connector 106. Optionally, the connector end 350 may be provided at the front 336 of the clasp body 330. The cable end 352 is configured to receive the cables 104 of the cable arrays 102, 103 through a cable entrance 354 at the cable end 352. The cable entrance 354 is provided at the first side 340, such as at the rear 338. The cable arrays 102, 103 transition from the first side 340 toward the second side 342 and transition forward toward the front 336 where the cables 104 exit the clasp body 330 at the connector end 350 through a cable exit 356. The cables 104 may be fanned out along the front 336 for interfacing with the electrical connector 106.

The clasp body 330 holds the cables 104 of the cable arrays 102, 103 in parallel arrangements as the cables 104 transition from the cable end 352 to the connector end 350. In an exemplary embodiment, the cable arrays 102, 103 are rotated or twisted by the clasp body 330 between the cable end 352 and the connector end 350. For example, the cable arrays 102, 103 may enter the cable management clasp 300 through the side 340 with a vertical arrangement and may exit the cable management clasp 300 from the front 336 with a horizontal arrangement. The cable arrays 102, 103 may be rotated about the elevation axis 348 (for example, to transition the cables 104 toward the front 336). The cable arrays 102, 103 may be rotated about the longitudinal axis 344 (for example, to transition the cables 104 from a vertical orientation to a horizontal orientation).

The clasp body 330 includes a guide bar 360 at the front 336. The guide bar 360 may define the cable exit 356. The guide bar 360 may be defined by the lower shell 328. The upper shell 326 defines a lid 362 of the guide bar 360 with an opening 364 surrounding the cable exit 356. The cables 104 exit from the clasp body 330 through the opening 364. The guide bar 360 orients the cables 104 relative to each other for connection with the electrical connector 106. Optionally, the guide bar 360 may include a plurality of cable grooves, similar to the cable grooves 162 (shown in FIG. 1) that receive corresponding cables 104 and hold relative positions of the cables 104.

The clasp body 330 includes a mandrel 370 along an interior bend or corner of the clasp body 330, such as at the first side 340. Optionally, the mandrel 370 may be defined by both the upper shell 326 and the lower shell 328. The mandrel 370 is used to guide and transition the cables 104 from the cable entrance 354 to the cable exit 356, such as to the guide bar 360. The mandrel 370 may define the cable entrance 354 at the first side 340. The upper and lower shells 326, 328 continue to surround the cables 104 entirely around the interior chamber 320 such that the upper and lower shells 326, 328 define a lid for the mandrel 370.

The mandrel 370 includes a trough 374 that receives the cables 104 and guides the cables 104 through a bend. The trough 374 has a curved ramp 376 defining a cable bend surface (not shown, internal surface of the ramp 376). The cable bend surface of the ramp 376 extends between opposite first and second rails 380, 382 (for example, the top and bottom of the clasp body 330 defined by the upper and lower shells 326, 328, respectively) that guide or hold the cables 104. The cable bend surface is an interior corner of the clasp body 330 about which the cables 104 transition from the cable end 352 to the connector end 350. The cable bend surface has a bend radius greater than a minimum bend radius of the cables 104 to prevent damage to the cables 104 as the cables 104 are bent around the cable bend surface. The cable bend surface of the mandrel 370 changes the direction of the cables 104 of the cable arrays 102, 103 from extending in a direction generally along the longitudinal axis 344 to a direction generally along the lateral axis 346.

In an exemplary embodiment, the mandrel 370 includes an organizer tray 390 at the cable end 352. The organizer tray 390 may be partially defined by the upper shell 326 and partially defined by the lower shell 328. Optionally, the organizer tray 390 may have a plurality of cable grooves, similar to the cable grooves 192 (shown in FIG. 1) configured to receive corresponding cables 104.

In the illustrated embodiment, the cable end 352 is oriented to receive the cable arrays 102, 103 along a vertical cable entrance plane and the connector end 350 is oriented to release the cable arrays 102, 103 along a horizontal cable exit plane. The cable entrance plane is defined by the longitudinal axis 344 and the elevation axis 348, and the cable exit plane is defined by the longitudinal axis 344 and the lateral axis 346. Other orientations are possible in alternative embodiments. The cable end 352 receives the cables 104 along the longitudinal axis 344 and the connector end 350 releases the cables 104 along the lateral axis 346.

Figure 6:
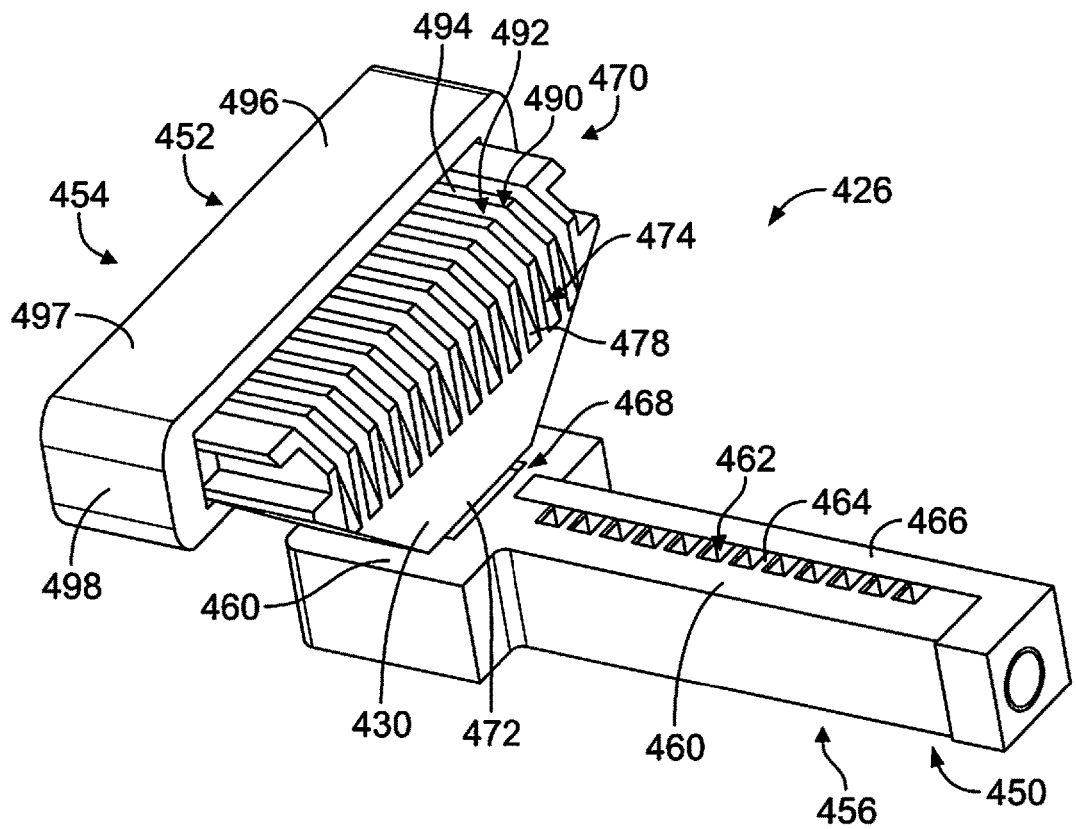
FIG. 6 is a rear perspective view of a cable management clasp formed in accordance with an exemplary embodiment.
Figure 7:
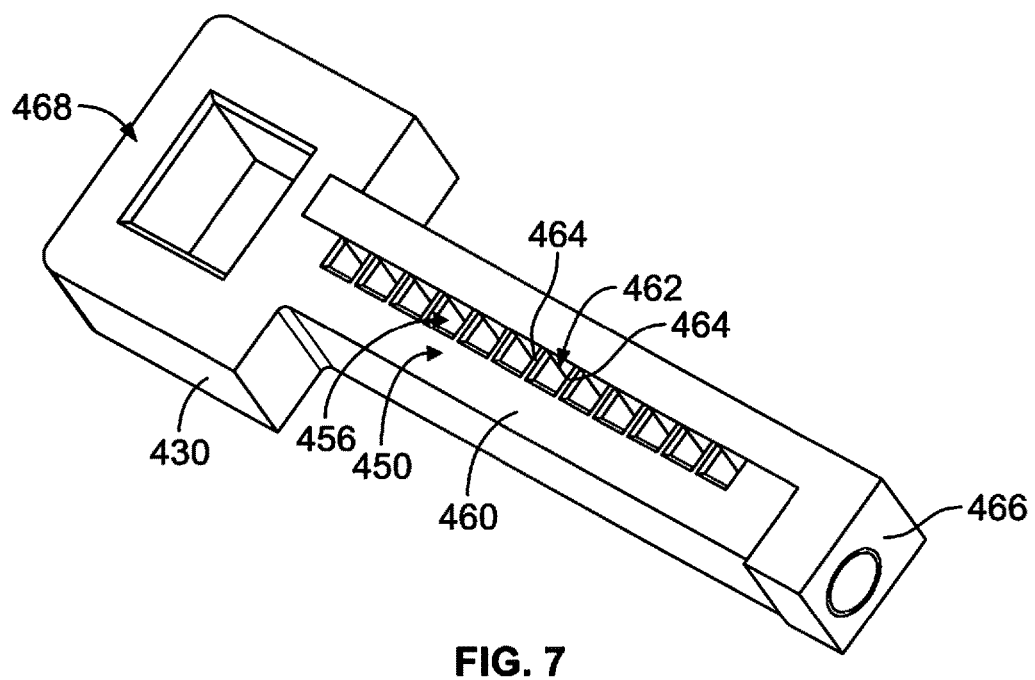
FIG. 7 is a perspective view of a guide bar of the cable management clasp shown in FIG. 6.
Figure 8:
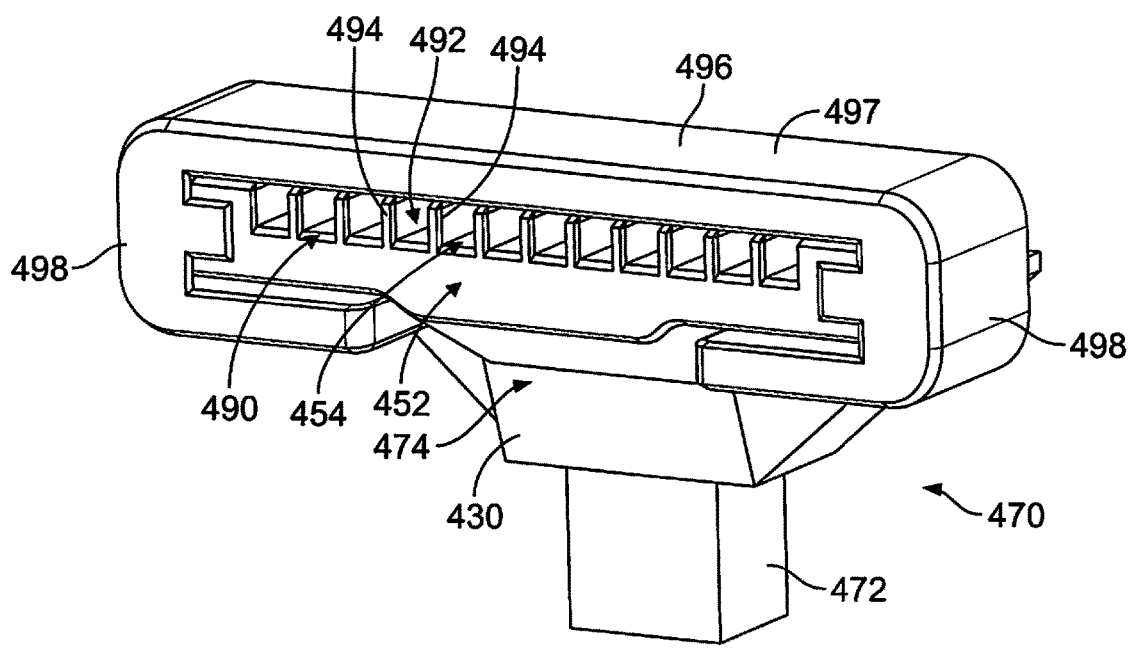
FIG. 8 is a perspective view of a mandrel of the cable management clasp shown in FIG. 6.

FIG. 6 is a rear perspective view of a cable management clasp 426 formed in accordance with an exemplary embodiment including a clasp body 430 having a guide bar 460 and a mandrel 470. FIG. 7 is a perspective view of the guide bar 460 in accordance with an exemplary embodiment. FIG. 8 is a perspective view of the mandrel 470 in accordance with an exemplary embodiment. The cable management clasp 426 may be similar to the cable management clasp 126 (shown in FIG. 1) in operation and/or effect to hold and guide transition of the cables 104 (shown in FIG. 1) to/from the electrical connector 106 (shown in FIG. 1); however the cable management clasp 426 has a multi-piece clasp body 430 rather than a single piece clasp body. The cable management clasp 426 limits the bending of the cables 104 during the transition, which reduces damage to the cables 104. The cable management clasp 426 is configured to hold the cables 104 in substantially fixed positions with respect to one another as the cables 104 extend through the cable management clasp 426.

The clasp body 430 includes multiple pieces that form the guide bar 460 and the mandrel 470 (and other parts). The pieces of the clasp body 430 may be molded from a plastic material or another material. The guide bar 460 is separate and discrete from the mandrel 470 and the mandrel 470 is coupled to the guide bar 460 to fix the position of the mandrel 470 relative to the guide bar 460. The clasp body 430 extends between a connector end 450 and a cable end 452. The connector end 450 may face and or be positioned at or near the electrical connector 106. Optionally, the connector end 450 may be provided at the front of the clasp body 430. The cable end 452 is configured to receive the cables 104 through a cable entrance 454 at the cable end 452. The cable entrance 454 is provided at one side of the clasp body 430 and may be provided generally at the rear of the clasp body 430. The cables 104 transition generally across the clasp body and forward toward the guide bar 460 where the cables 104 exit the clasp body 430 at the connector end 450 through a cable exit 456. The cables 104 may be fanned out along the guide bar 460 for interfacing with the electrical connector 106.

The clasp body 430 holds the cables 104 in parallel arrangements as the cables 104 transition from the cable end 452 to the connector end 450. In an exemplary embodiment, the cables 104 are rotated or twisted by the clasp body 430 between the cable end 452 and the connector end 450. For example, the cables 104 may enter the cable management clasp 426 through the side with a vertical arrangement and may exit the cable management clasp 426 from the front with a horizontal arrangement.

The guide bar 460 (FIG. 7) may define the cable exit 456. The guide bar 460 orients the cables 104 relative to each other for connection with the electrical connector 106. In an exemplary embodiment, the guide bar 460 includes a plurality of cable grooves 462 separated by tabs 464. The cable grooves 462 are configured to receive corresponding cables 104 and hold relative positions of the cables 104, which may correspond to positions of the cables 104 exiting the electrical connector 106. The tabs 464 may be scallop-shaped to cup around the cables 104 and hold the cables 104 in the cable grooves 462. The tabs 464 may have barbs or lances to dig into the jackets of the cables 104 to hold the clasp body 430 along the cables 104 and or to hold the relative positions of the cables 104 and the clasp body 430.

In an exemplary embodiment, an upper clasp 466 is removably coupled to the guide bar 460. The upper clasp 466 may form a lid for the guide bar 460. The upper clasp 466 may include securing features for securing to the guide bar 460, such as openings, slots, tabs, latches and the like. In other embodiments, the upper clasp 466 may be secured using fasteners or other securing means. The upper clasp 466 closes the cable grooves 462 and keeps the cables 104 in the cable grooves 462. In the illustrated embodiment, the cable grooves 462 are on a single side (for example, the top) of the guide bar 460 and a single clasp 466 is used to hold the cables 104 therein. In other embodiments, the cable grooves 462 may be on both sides of the guide bar 460 and multiple clasps 466 may be used or a single clasp 466 may be sued to covers both sets of cable grooves 462.

The guide bar 460 includes a socket 468 at an end thereof. The socket 468 includes an opening extending at least partially therethrough. The socket 468 receives the mandrel 470 to connect the mandrel 470 to the guide bar 460. The socket 468 may include securing features to secure the mandrel 470 thereto. The socket 468 may have any shape to allow connection with the mandrel 470.

The clasp body 430 includes a mandrel 470 (FIG. 8) along an interior bend or corner of the clasp body 430. The mandrel 470 is used to guide and transition the cables 104 from the cable entrance 454 to the cable exit 456, such as to the guide bar 460. The mandrel 470 may define the cable entrance 454.

The mandrel 470 includes a base 472, such as at a front of the mandrel 470. The base 472 is configured to be connected to the guide bar 460 to connect the mandrel 470 to the guide bar 460. For example, the base 472 may be received in and/or secured to the socket 468. The mandrel 470 includes a trough 474 extending from the base 472 that receives the cables 104 and guides the cables 104 through a cable bend surface 478. The cable bend surface 478 has a bend radius greater than a minimum bend radius of the cables 104 to prevent damage to the cables 104 as the cables 104 are bent around the cable bend surface 478.

In an exemplary embodiment, the mandrel 470 includes an organizer tray 490 at the cable end 452. The organizer tray 490 has a plurality of cable grooves 492 configured to receive corresponding cables 104. The cable grooves 492 are separated by tabs 494. The cable grooves 492 receive the cables 104 and hold relative positions of the cables 104. The tabs 494 may be scallop-shaped to cup around the cables 104 and hold the cables 104 in the cable grooves 492. The tabs 494 may have barbs or lances to dig into the jackets of the cables 104 to hold the clasp body 430 along the cables 104 and/or to hold the relative positions of the cables 104 and the clasp body 430. Optionally, each of the cable grooves 492 may receive a pair of the cables 104.

The cable management clasp 426 includes a clasp 496 attached to the clasp body 430 at the cable end 452, such as around the organizer tray 490. The clasp 496 and organizer tray 490 are configured to hold the cables 104 at the cable end 452. The clasp 496 may be a lid coupled to the mandrel 470. Optionally, the clasp 496 is generally C-shaped including a clasp arm 497 and clasp fingers 498 at opposite ends of the clasp arm 497. The clasp 496 is discrete from the clasp body 430 and the clasp fingers 498 are coupled to the mandrel 470 such that the cable entrance 454 is defined between the clasp arm 497 and the mandrel 470. The clasp 496 may include securing features for securing to the mandrel 470, such as openings, slots, tabs, latches and the like. In other embodiments, the clasp 496 may be secured using fasteners or other securing means. The clasp 496 closes the cable grooves 492 and keeps the cables 104 in the cable grooves 492.

Figure 9:
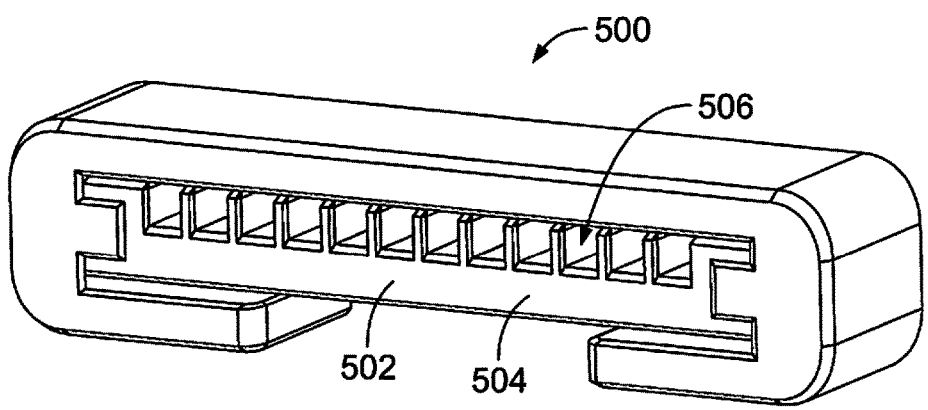
FIG. 9 is a perspective view of a cable management clasp in accordance with an exemplary embodiment.

FIG. 9 is a perspective view of a cable management clasp 500 in accordance with an exemplary embodiment. The cable management clasp 500 may be similar to the cable management clasp 126 (shown in FIG. 1) in operation and/or effect to hold and guide transition of the cables 104 (shown in FIG. 1) to/from the electrical connector 106 (shown in FIG. 1); however the cable management clasp 500 does not include a cable guide surface to transition the cables 104 around a bend. The cable management clasp 500 includes a clasp body 502 having a guide bar 504 that includes a cable organizer 506. The cable management clasp 500 may be used in place of the guide bar 160 (shown in FIG. 1) at the cable exits from the electrical connector 106. The cable management clasp may be used in place of the cable organizer 190 (shown in FIG. 1) of the mandrel 170 (shown in FIG. 1). Optionally, multiple cable management clasps 500 may be used in place of the cable management clasp 126. For example, one at the cable exit area, one at the cable entrance area and/or others along the transition between the entrance and exit areas.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The patentable scope should, therefore, be determined with reference to the appended claims, along with the full scope of equivalents to which such claims are entitled.

As used in the description, the phrase "in an exemplary embodiment" and the like means that the described embodiment is just one example. The phrase is not intended to limit the inventive subject matter to that embodiment. Other embodiments of the inventive subject matter may not include the recited feature or structure. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A cable management clasp comprising:
a clasp body extending between a connector end at or near an electrical connector and a cable end configured to receive a cable array of cables through a cable entrance, the cable array exiting the clasp body at the connector end through a cable exit, the clasp body holding the cables of the cable array in a parallel arrangement between the connector end and the cable end, the clasp body extending along mutually perpendicular longitudinal, lateral and elevation axes;
the clasp body having a mandrel including a cable bend surface interior of bends of each of the cables, the cable bend surface having a bend radius greater than a minimum bend radius of the cables, the cables transitioning around the cable bend surface between the cable entrance and the cable exit, the mandrel directing the cable array to rotate a roll angle about the elevation axis, the mandrel directing the cable array to rotate a yaw angle about the longitudinal axis.

2. The cable management clasp of claim 1, wherein the cable end is oriented to receive the cable array along a vertical cable entrance plane and the connector end is oriented to release the cable array along a horizontal cable exit plane.

3. The cable management clasp of claim 2, wherein the cable entrance plane is defined by the longitudinal axis and the elevation axis and the cable exit plane is defined by the longitudinal axis and the lateral axis.

4. The cable management clasp of claim 1, wherein the roll angle is approximately 90° and the yaw angle is approximately 90°.

5. The cable management clasp of claim 1, wherein the cable end receives the cables along the longitudinal axis and the connector end releases the cables along the lateral axis.

6. The cable management clasp of claim 1, wherein the cable bend surface is an interior corner of the clasp body about which the cables transition from the cable end to the connector end.

7. The cable management clasp of claim 1, wherein the mandrel includes a trough receiving the cables of the cable array, the trough having a ramp extending between opposite first and second rails, the ramp being curved and defining the cable bend surface.

8. The cable management clasp of claim 1, wherein the mandrel includes an organizer tray at the cable end, the organizer tray having a plurality of cable grooves configured to receive corresponding cables, the cable grooves being separated by tabs.

9. The cable management clasp of claim 1, wherein the clasp body includes a guide bar extending from the mandrel, the guide bar having a plurality of cable grooves configured to receive corresponding cables, the cable grooves being separated by tabs.

10. The cable management clasp of claim 9, wherein the guide bar is separate and discrete from the mandrel, the mandrel being coupled to the guide bar to fix the position of the mandrel relative to the guide bar.

11. The cable management clasp of claim 1, further comprising a clasp attached to the clasp body at the cable end, the clasp and clasp body configured to hold the cables of the cable array at the cable end.

12. The cable management clasp of claim 11, wherein the clasp is c-shaped including a clasp arm and clasp fingers at opposite ends of the clasp arm, the clasp being discrete from the clasp body and the clasp fingers being coupled to the mandrel such that the cable entrance is defined between the clasp arm and the mandrel.

13. The cable management clasp of claim 11, wherein the clasp is tape wrapping around the mandrel and the cable array.

14. The cable management clasp of claim 1, wherein the mandrel comprises first and second shells coupled together and defining an interior chamber, the first and second shells completely surrounding the cables between the cable end and the connector end, at least one of the first and second shells defining the cable bend surface.

15. The cable management clasp of claim 1, wherein the clasp body includes a top, a bottom, a front, a rear, and opposite first and second sides, the front facing the electrical connector, the connector end being defined at the front, the cable end being provided at the first side, the mandrel supporting the cables along the rear from the cable end as the cables transition away from the first side and toward the front.

16. The cable management clasp of claim 15, wherein the clasp body is configured to guide first and second cable arrays of cables from the cable end to the connector end, the mandrel supporting both the first and second cable arrays along the rear, the clasp body comprising a guide bar extending from the mandrel at the front, the guide bar comprising an upper guide surface and a lower guide surface facing the top and the bottom, respectively, the upper guide surface supporting the first cable array, the lower guide surface supporting the second cable array.

17. A cable management clasp comprising:
a clasp body extending between a connector end at or near an electrical connector and a cable end configured to receive a cable array of cables through a cable entrance, the cable array exiting the clasp body at the connector end through a cable exit, the clasp body holding the cables of the cable array in a parallel arrangement between the connector end and the cable end, the clasp body extending along mutually perpendicular longitudinal, lateral and elevation axes;
the clasp body having a guide bar at the connector end, the guide bar holding the cables of the cable array generally along a cable exit plane defined by the longitudinal axis and the lateral axis with the cables exiting the cable exit along the lateral axis;
the clasp body having a mandrel including a cable bend surface interior of bends of each of the cables, the cable bend surface having a bend radius greater than a minimum bend radius of the cables, the cables transitioning around the cable bend surface between the cable entrance and the cable exit, the mandrel having an organizer tray at the cable end, the organizer tray receiving the cables of the cable array through the cable entrance and holding the cables of the cable array generally along a cable entrance plane defined by the longitudinal axis and the elevation axis with the cables entering the cable entrance along the longitudinal axis.

18. The cable management clasp of claim 17, wherein the mandrel directs the cable array to rotate a roll angle about the elevation axis, and the mandrel directing the cable array to rotate a yaw angle about the longitudinal axis.

19. The cable management clasp of claim 17, wherein the clasp body is configured to guide first and second cable arrays of cables from the cable end to the connector end, the mandrel supporting both the first and second cable arrays along the cable bend surface, the clasp body comprising a guide bar extending from the mandrel at the connector end, the guide bar comprising an upper guide surface and a lower guide surface, the upper guide surface supporting the first cable array, the lower guide surface supporting the second cable array.

20. A communication system comprising:
first and second electrical connectors each including signal conductors;
a plurality of cable arrays extending between the first and second electrical connectors, each cable array having a plurality of cables electrically connected to corresponding conductors of the first and second electrical connectors, the cables being arranged in a parallel arrangement with the other cables of the corresponding cable array; and
a first cable management clasp holding the cable arrays, the first cable management clasp being positioned at or near the first electrical connector to transition the cables into the first electrical connector, the first cable management clasp comprising a clasp body extending between a connector end facing the first electrical connector and a cable end configured to receive the cable arrays through a cable entrance, the cable arrays exiting the clasp body at the connector end through a cable exit, the clasp body holding the cables of the cable arrays in the parallel arrangements between the connector end and the cable end, the clasp body extending along mutually perpendicular longitudinal, lateral and elevation axes, the clasp body having a mandrel including a cable bend surface interior of bends of each of the cables, the cable bend surface having a bend radius greater than a minimum bend radius of the cables, the cables transitioning around the cable bend surface between the cable entrance and the cable exit, the mandrel directing the cable arrays to rotate a roll angle about the elevation axis, the mandrel directing the cable arrays to rotate a yaw angle about the longitudinal axis.

* * * * *